(12) United States Patent
Randolph et al.

(10) Patent No.: US 6,743,677 B1
(45) Date of Patent: Jun. 1, 2004

(54) METHOD FOR FABRICATING NITRIDE MEMORY CELLS USING A FLOATING GATE FABRICATION PROCESS

(75) Inventors: Mark W. Randolph, San Jose, CA (US); Darlene G. Hamilton, San Jose, CA (US); Binh Quang Le, San Jose, CA (US); Wei Zheng, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/306,529

(22) Filed: Nov. 27, 2002

(51) Int. Cl.$^7$ .............................................. H01L 21/336
(52) U.S. Cl. ....................... 438/257; 438/211
(58) Field of Search ................................ 438/197, 211, 438/241, 257, 258

(56) References Cited

U.S. PATENT DOCUMENTS 6,355,514 B1 * 3/2002 Pham
6,479,859 B2 * 11/2002 Hsieh et al.

* cited by examiner

Primary Examiner—Phuc T. Dang

(57) ABSTRACT

The present invention is a method for fabricating nitride memory cells using a floating gate fabrication process. In one embodiment of the present invention, the fabrication process of a floating gate memory cell is accessed. The floating gate memory cell fabrication process is then altered to produce an altered floating gate memory cell fabrication process. The altered floating gate memory cell fabrication process is then used to form a nitride memory cell.

14 Claims, 5 Drawing Sheets

METHOD FOR FABRICATING NITRIDE MEMORY CELLS USING A FLOATING GATE FABRICATION PROCESS

TECHNICAL FIELD

The present invention relates to the fabrication of semiconductor structures. More specifically, the present invention pertains to a method for fabricating NROM cell devices using a floating gate fabrication process.

BACKGROUND ART

Flash memory devices have found growing commercial success in the electronic device market. This is due in part to the ability of flash memory devices to store electronic data over long periods of time without an electric power supply. Additionally, flash memory devices can be erased and programmed by an end user after they are installed in an electronic device. This combined functionality is especially useful in electronic device applications where power supply is intermittent and programmability and data retention are desired such as cellular telephones, personal digital assistants, computer BIOS storage, etc.

Flash memory devices are typically configured as an array of individual memory transistors that are oriented in row and columns. This array is sometimes referred to as the core, and the memory transistors are often referred to as cells, or core cells. FIG. 1 is a cross section view of an exemplary prior art NOR memory cell. NOR cell 100 is comprised of a substrate 101 having a source region 102 and a drain region 103. Typically, substrate 101 is a crystalline silicon semiconductor substrate which has undergone an N-type (electron rich) doping in source area 102 and drain area 103. In NOR cell 100, source area 102 is comprised of a Double Diffused Implant (DDI) 105 for reducing unwanted band to band tunneling current, and a Modified Drain Diffusion implant (MDD) 106 in source area 102 and a MDD implant 107 in drain area 103. The MDD implants provide definition of the source and drain areas (e.g., areas 102 and 103 respectively). NOR cell 100 further comprises a gate array 104. In the embodiment of FIG. 1, gate array 104 is comprised of a tunnel oxide layer 108, a floating gate 109, an insulating layer 110, and a control gale 111. Typically, the substrate area underlying gate array 104 (e.g., area 104a of FIG. 1) is a lightly doped P-type (electron deficient) substrate.

Typically, the control gates (e.g., control gate 111 of FIG. 1) of the memory cells in each row of the core are connected to a series of word lines, thus forming individual rows of cells that can be accessed by selecting the corresponding word line. Similarly, the drain areas of the cells (e.g., drain area 103 of FIG. 1) in each column of the core are connected to a series of bit lines, thus forming individual columns of cells that can be accessed by selecting the corresponding bit lines. Finally, the source areas of the cells (e.g., source area 102 of FIG. 1) in the array are connected to a common source line. In some flash memory devices, the array of transistors is further subdivided into sectors of separate transistor arrays to provide added flexibility for the programming and erasing operations. NOR flash memory arrays are typically connected the memory cell in parallel between bit lines and ground lines. In a typical NOR flash memory array, a common source is shared between two floating gate arrays (e.g., floating gate array 104 of FIG. 1) and a common source is shared between two floating gate arrays. NOR flash memory arrays are used when high-speed data access a critical design factor.

The data stored in each memory cell represents a binary 1 or 0. To perform a program read or erase operation on a particular cell in the array, various predetermined voltages are applied to control gate 111, drain area 103 and source area 102 of a memory cell. Thus, by applying these predetermined voltages to a particular bit line column, a particular word line row, and the common source line, an individual cell at the intersection of the bit line and word line (e.g., memory cell 100) can be selected for reading or programming.

In many flash memory devices, non-volatility of the memory cells is achieved by adding a floating gate (e.g., floating gate 109 of FIG. 1) between the control gate 111 and the substrate region 101 of the transistors. Typically, the cells of the flash memory device are programmed by applying a predetermined raised voltage to the control gate 111 and the drain area 103 of the cell and grounding the source area 102. As a result, the voltages on the control gate 111 and the drain area 103 cause the generation of hot electrons that are injected onto floating gate 109, where they become trapped. This electron transfer mechanism is often referred to as Channel Hot Electron (CHE) injection. When the programming voltages are removed, the negative charge on floating gate 109 remains, thereby raising the threshold voltage of memory cell 100. The threshold voltage is then used during reading operations to determine if memory cell 100 is in a charged or programmed state (0), or whether memory cell 100 is in an uncharged or erased state (1).

Typically, memory cells are read by applying a lower predetermined voltage to the control gate 111 and the drain area 103 and grounding the source area 102 of the memory cell. The current in the bit line is then sensed with a sense amplifier. If the cell is programmed, the threshold voltage will be relatively high and the bit line current will be zero, or at least relatively low, thus registering a binary 0. If the cell is erased, the threshold voltage will be relatively low and the bit line current will be relatively high, thus registering a binary 1.

In contrast to the programming procedure, flash memory devices can be bulk erased by simultaneously erasing all the cells in a memory sector. One procedure for erasing an entire memory sector involves applying predetermined voltages to the common source line (e.g., source area 102 of FIG. 1) and all the word lines (e.g., control gate 111 of FIG. 1) of the sector while the drain areas of the cells (e.g., drain area 103 of FIG. 1) are left to float. This causes electron tunneling from the floating gate 109 to the source area 102 through Fowler-Nordheim (F-N) tunneling, thereby removing the negative charge from the floating gate 109 of each of the cells in the memory sector being erased.

Fabricating semiconductor devices such as memory cell 100 involves multiple deposition, masking, etching, and doping steps in order to create the structures comprising the device. For example, referring to FIG. 1, cell V+ implanting is usually performed first upon substrate 101 to create a lightly doped electron deficient area (e.g., area 104a of FIG. 1) in substrate 101. Next, a tunnel oxide layer (e.g., tunnel oxide layer 108 is then deposited and is followed by a floating gate fabrication process is performed. Typically, this requires the deposition of layer of polysilicon which is doped, either during deposition of the polysilicon layer, or in subsequently a subsequent processing step. The floating gate layer then undergoes photolithography in order to pattern floating gate 109.

Photolithography techniques are often used in the fabrication of semiconductor structures. In one photolithography process, a pattern mask that defines the size and shape of a component in a semiconductor structure is positioned above a photosensitive layer (e.g., photoresist) that has been applied over a layer of material such as the polysilicon layer. A stepper holds the pattern mask over the photoresist and the pattern image is projected onto the photoresist through a lens. The pattern is then imprinted into the photoresist, for example, by hardening the portion of the photoresist that is exposed through the pattern mask, while the other (unexposed) portion of the photoresist remains relatively soft The softer portion of the photoresist is then removed, leaving only the harder portion on the layer. In this manner, the pattern is reproduced in the photoresist on the surface of the polysilicon layer. A portion of the polysilicon layer not underlying the photoresist is then removed by etching. The portion of the polysilicon layer not removed will be in the shape of floating gate 109 defined by the pattern. The photoresist is then removed and the process is repeated as needed to build each layer of the semiconductor structure.

After floating gate 109 has been formed, a fabrication process is performed to create insulating layer 110. For example, a layer of insulating material such as an oxide nitride oxide (ONO) stack is deposited and, using photolithography, etched to create insulating layer 110. Next, a control gate fabrication process is performed. A polysilicon layer is deposited, doped, and etched in a process similar to the above described process for forming floating gate 109.

Following the forming of gate array 104, a self-aligned source (SAS) etch is performed to penetrate tunnel oxide layer 107 in the region of source area 102. Referring to FIG. 1, a Double Diffusion Implanting (DDI) is performed in order to reduce unwanted band to band tunneling current. Then, a Modified Drain Diffusion implanting (MDD) is performed to define source area 102 and drain area 103. A drive/anneal process is performed to diffuse the implanted ions farther into substrate 101 and to remove damage to silicon substrate 101 which may have been incurred during the DDI and MDD implanting steps. Finally, VSS implanting is performed in source area 102.

Manufacturers are constantly trying to reduce the number of steps in their fabrication processes in order to gain a competitive advantage. Altering the fabrication process of memory cell 100 can reduce the number of fabrication steps required and significantly reduce the cost of production of the flash memory device. Fewer fabrication steps may also result in reduced resource costs, such as materials and labor, and thus further reduce production costs for the manufacturer. Additionally, with fewer steps in the fabrication process there is a reduced probability for manufacturing defects in the device which results in lower per-device production costs for the manufacturer.

However, implementing a new fabrication process requires considerable resources on the part of the manufacturer. A manufacturer may have to alter or entirely revamp the process libraries and process flows in order to implement a new fabrication process. Additionally, re-tooling the fabrication line is expensive and can result in significant down time for the manufacturing facility. As an example, when new fabrication processes are implemented, new photolithography masks are frequently required which can be very expensive due to their extremely precise manufacturing tolerances. Additionally, implementing new process flows necessitates testing to viability of the new process flow and to ensure that the new semiconductor device functions properly prior to commencing full scale production.

DISCLOSURE OF THE INVENTION

Accordingly, a need exists for a method for fabricating a semiconductor device, such as a Flash memory device, which requires fewer fabrication steps. While meeting the above stated need, it is desirable to provide a method for fabricating a Flash memory device which is compatible with existing manufacturing process and equipment.

The present invention is a method for fabricating nitride memory cells using a floating gate fabrication process. In one embodiment of the present invention, the fabrication process of a floating gate memory cell is accessed. The floating gate memory cell fabrication process is then altered to produce an altered floating gate memory cell fabrication process. The altered floating gate memory cell fabrication process is then used to form a nitride memory cell.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

MODES FOR CARRYING OUT THE INVENTION

Reference will now be made in detail to embodiments of the present invention, examples of which are illustrated in the accompanying drawings. While the present invention will be described in conjunction with the following embodiments, it will be understood that they are not intended to limit the present invention to these embodiments alope. On the contrary, the present invention, is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 2:
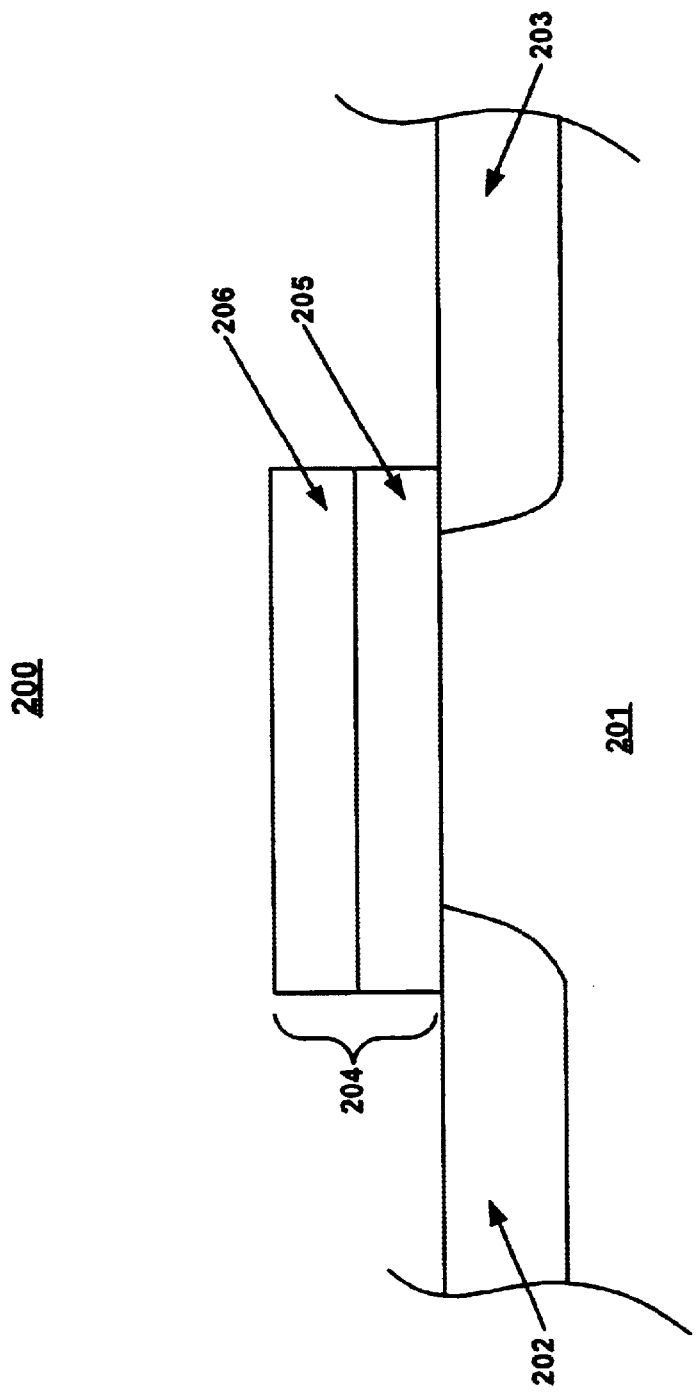
FIG. 2 is a cross section view of an exemplary nitride memory cell fabricated in accordance with embodiments of the present invention.

FIG. 2 is a cross section view of an exemplary nitride memory cell fabricated in accordance with embodiments of the present invention. In embodiments of the present invention, memory cell 200 is used to store a single bit of data. However, in embodiments of the present invention, memory cell 200 can be configured to store a plurality of data bits. Nitride memory cell is comprised of a substrate 201 having a source area 202 and a drain area 203. In embodiments of the present invention, source area 202 and drain area 203 are defined by MDD implants. Nitride memory cell 200 further comprises a nitride gate array 204 comprising an oxide nitride oxide (ONO) layer 205 and a control gate 206.

Figure 1:
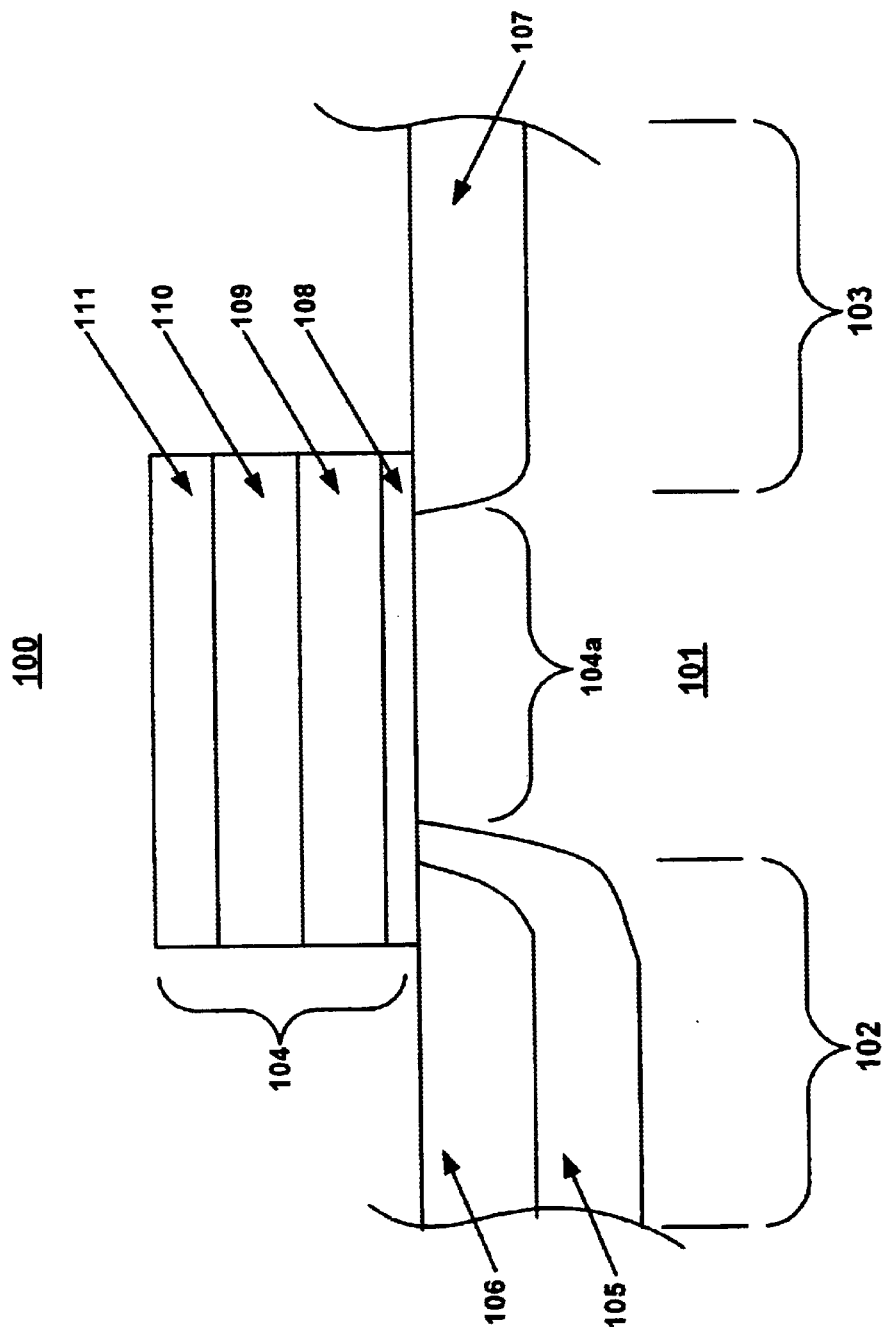
FIG. 1 is a cross section view of an exemplary prior art NOR memory cell.
Figure 3:
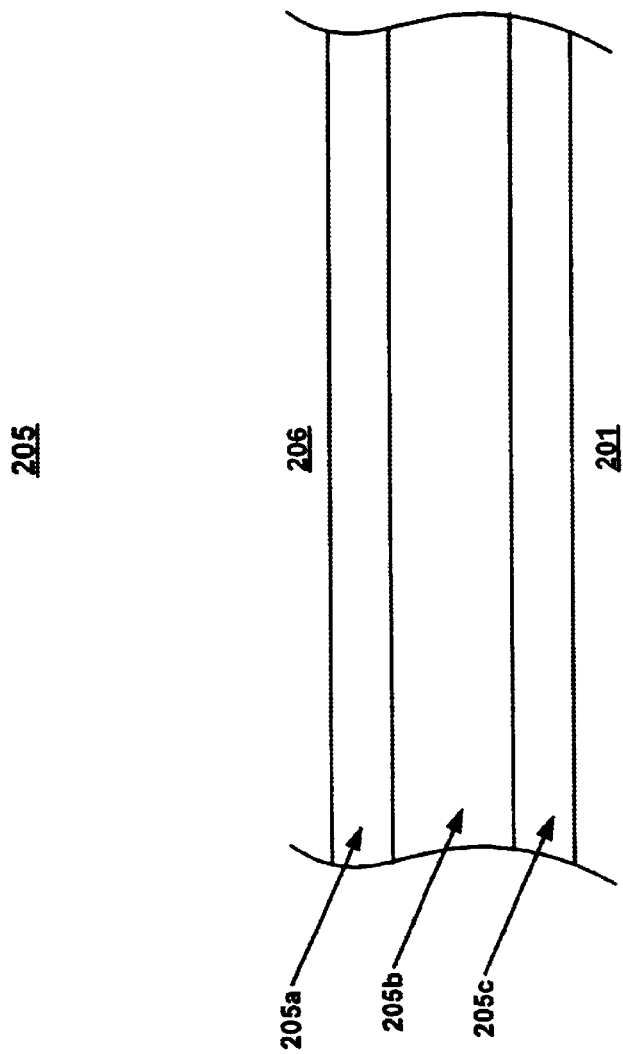
FIG. 3 is a cross section view showing in greater detail an exemplary nitride memory cell fabricated in accordance with embodiments of the present invention.

FIG. 3 shows ONO layer 205 in greater detail in accordance with one embodiment of the present invention. In FIG. 3, ONO layer 205 is comprised of a nitride layer 205b disposed between two oxide layers 205a and 205c. Referring again to FIG. 1, ONO layer 205 replaces the tunnel oxide layer 108, floating gate layer 109, and insulating layer 110 of floating gate array 104. ONO layer 205 acts as both an insulating layer and a storage structure in memory cell 200. In embodiments of the present invention, memory cell 200 is programmed by storing a charge in the nitride layer 205b of ONO layer 205 while oxide layers 205a and 205c act as insulating layers.

Figure 4:
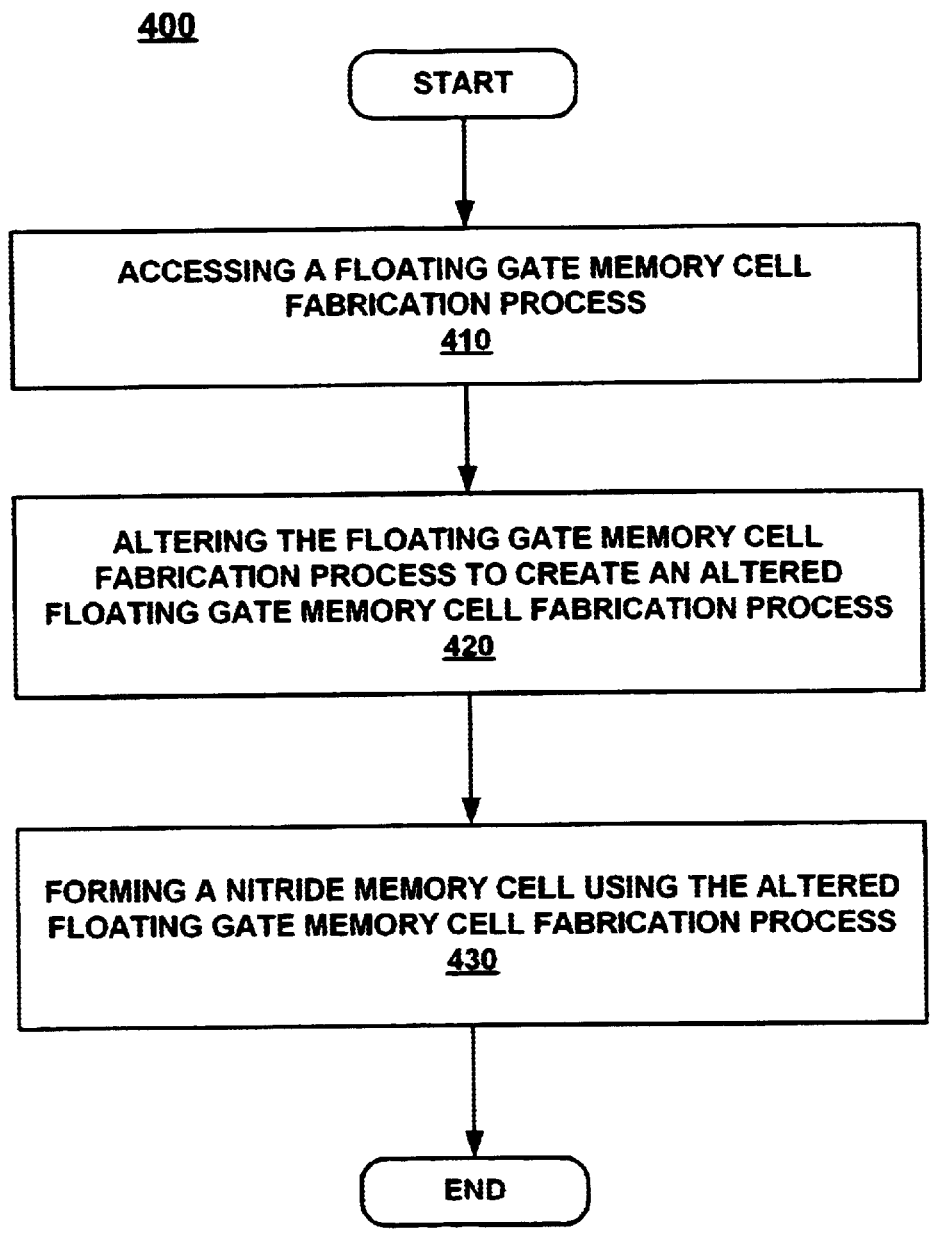
FIG. 4 is a flow chart of the steps involved in fabricating a nitride memory cell in accordance with embodiments of the present invention.

FIG. 4 is a flow chart of the steps involved in fabricating a nitride memory cell in accordance with embodiments of the present invention. In step 410 of FIG. 4, a floating gate memory cell fabrication process is accessed.

In step 420 of FIG. 4, the floating gate memory cell fabrication process is altered to create an altered floating gate memory cell fabrication process. In embodiments of the present invention, altering the fabrication process comprises omitting process steps from the floating gate memory cell fabrication process. For example, in embodiments of the present invention, the tunnel oxide layer deposition, the floating gate fabrication steps, and the insulating layer fabrication steps are omitted from the gate array. Instead, an oxide nitride oxide layer (e.g., ONO layer 205 of FIG. 2) is deposited and defined. Finally, control gate 206 is deposited, doped, and etched. Thus, embodiments of the present invention fabricate a nitride memory cell in a NOR memory array. This allows manufacturers to simplify fabrication of the memory cells in a NOR memory array without necessitating extensive modification the process libraries. However, while the present embodiment recites fabricating memory cells within a NOR memory array, the present invention is well suited for fabricating memory cells in other types of memory arrays also.

One benefit of embodiments of the present invention is that manufacturers can implement the present invention without the need for extensive testing of the process to ensure its viability. Because the present invention accesses a working floating gate memory cell fabrication process, it is not necessary to perform extensive testing to ensure the viability of the fabrication process. Furthermore, the present invention can be implemented using existing photolithographic masks from the floating gate memory cell fabrication process which constitutes a sizeable savings for the manufacturer.

Additionally, some of the most difficult fabrication steps of the floating gate memory cell fabrication process (e.g., floating gate fabrication and Self-Aligned Source etching to the source area) are eliminated. In prior art floating gate memory cell fabrication, high tolerances in the photoresist are required due to the tight pitch of the floating gate structure. The SAS etch required precise alignment of the photoresist with the gate array structures in order to fully contact the source area and not contact the drain area. In embodiments of the present invention, these steps are eliminated, thus simplifying the fabrication process.

In step 430 of FIG. 4, a nitride memory cell (e.g., nitride memory cell 200 of FIG. 2) is formed using the altered floating gate memory cell fabrication process. In one embodiment, the nitride memory cell comprises ONO layer 205, control gate 206, source area 202, and drain area 203.

Figure 5:
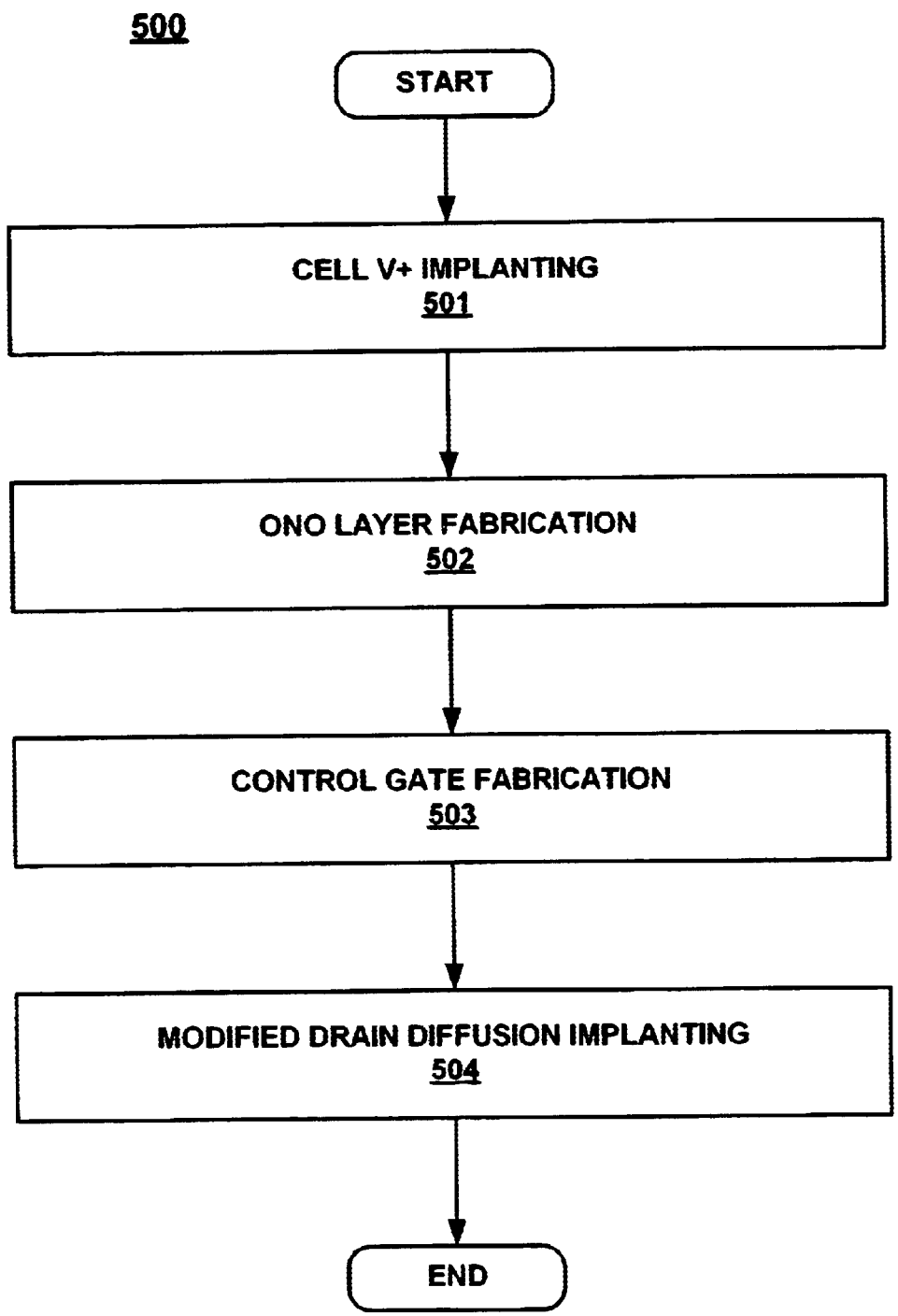
FIG. 5 is a flow chart of an altered floating gate memory cell fabrication process in accordance with embodiments of the present invention.

FIG. 5 is a flow chart of an altered floating gate memory cell fabrication process in accordance with embodiments of the present invention. Referring now to FIG. 2, and to step 501 of FIG. 5, cell V+ implanting is performed. In embodiments of the present invention, V+ implanting is performed on substrate 201 to introduce additional P-type ions into the depletion area beneath nitride gate array 204 of FIG. 2.

In embodiments of the present invention, a modified isolation step is performed, to isolate memory cells in the core, using isolation implants. In one embodiment of the present invention, the field oxide layer in the core is eliminated and isolation implants are used to isolate the memory cells within the core array. In one embodiment, P-type implants such as boron are used for this purpose. While the present invention recites using isolation implants for device isolation within the core array, the present invention is well suited to utilize other method as well. In prior art flash memory cell fabrication, device separation was accomplished by, for example, shallow trench isolation, or field oxide formation. In embodiments of the present invention, shallow trench isolation (STI) of a field oxide is used to isolate the core array from periphery devices.

In a typical STI process, an anisotropic etch of the silicon substrate is performed followed by the deposition of a dielectric layer of SiO2 and polysilicon, followed by a Chemical Mechanical Polishing to planarize the structure. While the present embodiment recites using STI to isolate the core, array, the present invention is well suited to utilize other methods as well.

Referring now to FIG. 2, and to step 502 of FIG. 5, an oxide nitride oxide (ONO) layer 205 is fabricated. In one embodiment, this comprises depositing the oxide, nitride, and oxide layers and performing a photolithographic etch in order to define ONO 205.

ONO layer 205 replaces tunnel oxide layer 108, floating gate 109, and insulating layer 110 of floating gate memory cell 100. This greatly simplifies fabricating memory cell 200 and facilitates manufacturing more memory devices in a given period of time compared to prior art fabrication processes. Additionally, a greater savings in materials and labor may be realized.

Referring now to FIG. 2, and to step 503 of FIG. 5, a control gate is fabricated. Again, a polysilicon layer is deposited, doped, and etched to create control gate 206.

Referring now to FIG. 3, and to step 504 of FIG. 5, a Modified Drain Diffusion (MDD) implanting is performed. MDD implanting is performed in order to define source area 202 and drain area 203. However, while MDD implanting is recited in the present embodiment, the present invention is well suited to utilize other methods for defining source area 202 and drain area 203. The SAS etch, DDI implanting, and drive/anneal steps which were performed in the prior art floating gate memory cell fabrication process are omitted in the nitride memory cell fabrication steps of the present invention.

The present invention provides a method for fabricating a nitride memory cell in a NOR memory array which utilizes fewer processing steps than prior art NOR memory array fabrication processes, thereby increasing production while conserving manufacturing resources. Furthermore, the present invention does not require a manufacturer to make significant expenditures purchasing new equipment and developing new manufacturing process flows.

The preferred embodiment of the present invention, a method for fabricating nitride memory cells using a floating gate fabrication process, is thus described. While the present invention has been described in particular embodiments, it should be appreciated that the present invention should not be construed as limited by such embodiments, but rather construed according to the following claims.

What is claimed is:

1. A method for fabricating a memory device comprising:

accessing a floating gate memory cell fabrication process;

altering said floating gate memory cell fabrication process to produce an altered floating gate memory cell fabrication process wherein a nitride memory cell is fabricated on a NOR memory array; and forming said nitride memory cell using said altered floating gate memory cell fabrication process.

2. The method as recited in claim 1, wherein said altering of said floating gate memory cell fabrication process comprises:

omitting steps for depositing a field oxide; and forming an isolation implant in a substrate coupled with said nitride memory cell for electrically isolating said nitride memory cell.

3. The method as recited in claim 1, wherein said altering of said floating gate memory cell fabrication process comprises:

removing a tunnel oxide deposition step from said floating gate memory cell fabrication process; and omitting steps for fabricating a polysilicon floating gate from said floating gate memory cell fabrication process.

4. The method as recited in claim 1, wherein said altering of said floating gate memory cell fabrication process further comprises omitting steps for performing a self-aligned source etch from said floating gate memory cell fabrication process.

5. The method as recited in claim 1, wherein said altering of said floating gate memory cell fabrication process further comprises omitting steps for performing a double diffused implant from said floating gate memory cell fabrication process.

6. The method as recited in claim 1, wherein said altering of said floating gate memory cell fabrication process further comprises omitting steps for performing a drive/anneal process from said floating gate memory cell fabrication process.

7. The method as recited in claim 1, wherein said altered floating gate memory cell fabrication process further comprises configuring a NOR memory array for storing a plurality of data bits in said nitride memory cell.

8. A method for fabricating a flash memory device comprising:

accessing a floating gate memory cell fabrication process for a NOR memory array;

altering said floating gate fabrication process to create an altered floating gate memory cell fabrication process wherein a nitride memory cell is fabricated on a NOR memory array; and forming a nitride memory cell in said NOR memory array using said altered floating gate memory cell fabrication process.

9. The method as recited in claim 8, wherein said altered floating gate memory cell fabrication process further comprises isolating said nitride memory cell from a second nitride memory cell using an isolation implant.

10. The method as recited in claim 8, wherein said altering of said floating gate memory cell fabrication process comprises:

omitting a tunnel oxide deposition step from said floating gate memory cell fabrication process; and omitting steps for fabricating a floating gate from said floating gate memory cell fabrication process.

11. The method as recited in claim 8, wherein said altering of said floating gate memory cell fabrication process further comprises omitting steps for performing a self-aligned source etch from said floating gate memory cell fabrication process.

12. The method as recited in claim 1, wherein said altering of said floating gate memory cell fabrication process further comprises omitting steps for performing a double diffused implant from said floating gate memory cell fabrication process.

13. The method as recited in claim 8, wherein said altering of said floating gate memory cell fabrication process further comprises omitting steps for performing a drive/anneal process from said floating gate memory cell fabrication process.

14. The method as recited in claim 8, wherein said altered floating gate memory cell fabrication process further comprises configuring said NOR memory array for storing a plurality of data bits in said nitride memory cell.

* * * * *